(12) United States Patent
Basu et al.

(10) Patent No.: US 9,129,825 B2
(45) Date of Patent: Sep. 8, 2015

(54) FIELD EFFECT TRANSISTOR INCLUDING A REGROWN CONTOURED CHANNEL

(71) Applicant: International Business Machines Corporation, Armonk, NY (US)

(72) Inventors: Anirban Basu, Elmsford, NY (US); Pouya Hashemi, White Plains, NY (US); Ali Khakifirooz, Mountain View, CA (US)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 14/070,038

(22) Filed: Nov. 1, 2013

(65) Prior Publication Data

US 2015/0123205 A1    May 7, 2015

(51) Int. Cl.
*H01L 27/02* (2006.01)
*H01L 21/20* (2006.01)
*H01L 29/06* (2006.01)
*H01L 29/78* (2006.01)
*H01L 29/66* (2006.01)
*H01L 21/762* (2006.01)

(52) U.S. Cl.
CPC ........ *H01L 29/0653* (2013.01); *H01L 21/7624* (2013.01); *H01L 29/66545* (2013.01); *H01L 29/78* (2013.01)

(58) Field of Classification Search
CPC ............ H01L 27/0259; H01L 27/0251; H01L 27/0255; H01L 21/2011; H01L 21/76264
USPC ....................................................... 257/352
See application file for complete search history.

(56) References Cited

U.S. PATENT DOCUMENTS

| 6,362,060 | B2 | 3/2002 | Ahn et al. |
| 7,238,594 | B2 | 7/2007 | Fonash et al. |
| 7,312,492 | B2 | 12/2007 | Gruning-Von Schwerin |
| 7,592,229 | B2 | 9/2009 | Lin |
| 8,153,492 | B2 | 4/2012 | Fung |
| 8,368,049 | B2 | 2/2013 | Kawashima et al. |
| 8,673,708 | B2 * | 3/2014 | Cheng et al. .................. 438/183 |
| 2006/0148154 | A1 * | 7/2006 | Shin et al. ..................... 438/198 |
| 2009/0146194 | A1 | 6/2009 | Moselund et al. |

OTHER PUBLICATIONS

Moselund, K.E. et al., "The High-Mobility Bended n-Channel Silicon Nanowire Transistor" IEEE Transactions on Electron Devices (Apr. 2010) pp. 866-876, vol. 57, No. 4.

* cited by examiner

*Primary Examiner* — Matthew W Such
*Assistant Examiner* — Monica D Harrison
(74) *Attorney, Agent, or Firm* — Scully, Scott, Murphy & Presser, P.C.; Louis J. Percello, Esq.

(57) ABSTRACT

At least one doped semiconductor material region is formed over a crystalline insulator layer. A disposable gate structure and a planarization dielectric layer laterally surrounding the disposable gate structure are formed over the at least one doped semiconductor material region. The disposable gate structure is removed selective to the planarization dielectric layer to form a gate cavity. Portions of the at least one doped semiconductor material region are removed from underneath the gate cavity. Remaining portions of the at least one doped semiconductor material region constitute a source region and a drain region. A faceted crystalline dielectric material portion is grown from a physically exposed surface of the crystalline insulator layer. A contoured channel region is epitaxially grown on the faceted crystalline dielectric material portion. The contoured channel region increases the distance that charge carriers travel relative to a separation distance between the source region and the drain region.

20 Claims, 11 Drawing Sheets

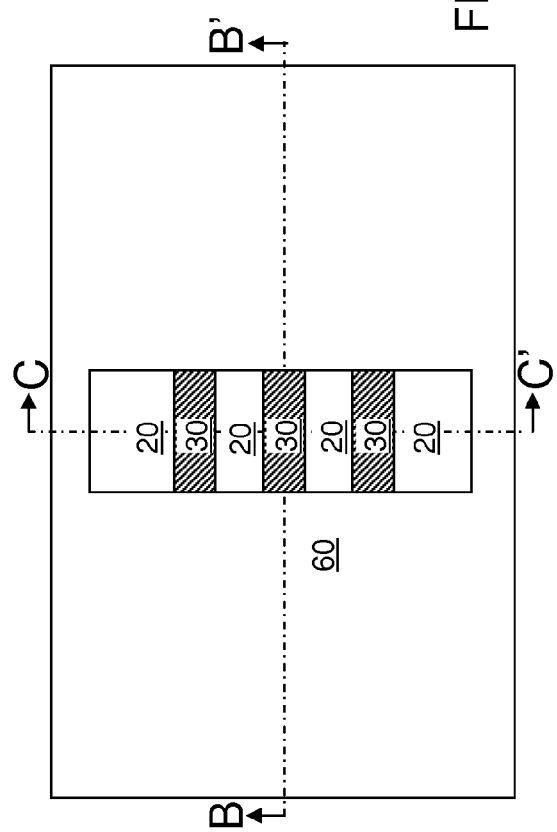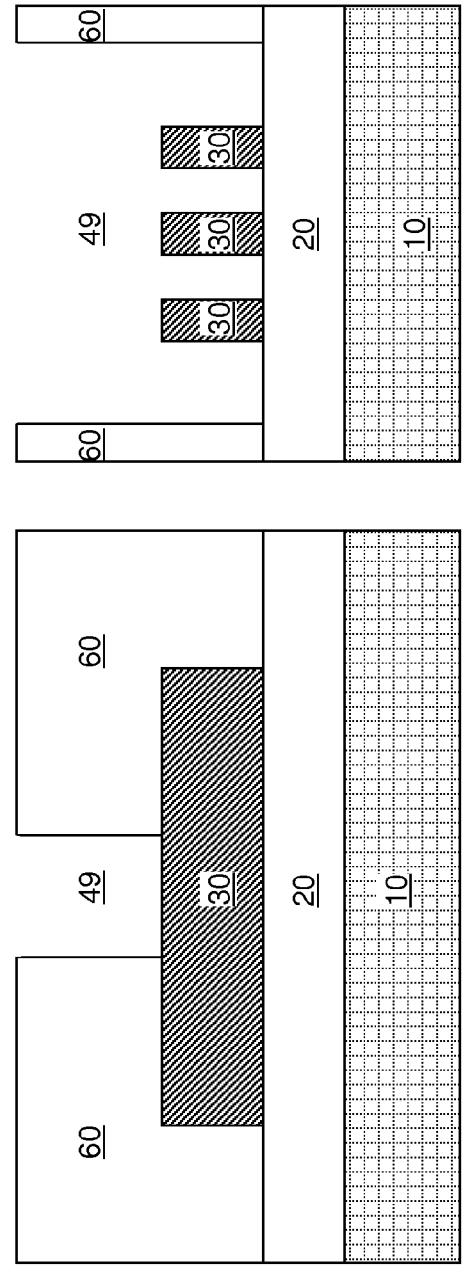

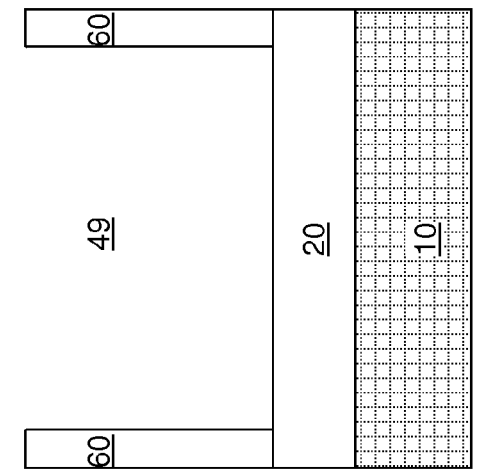
FIG. 5C
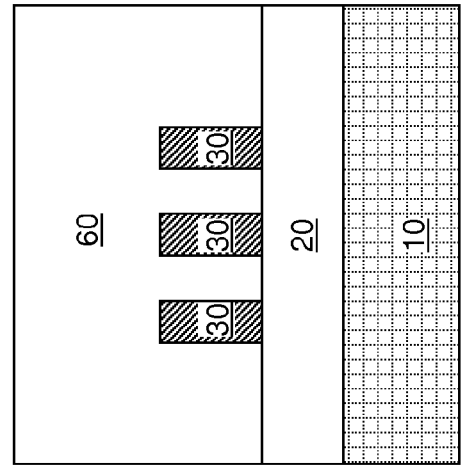
FIG. 5D
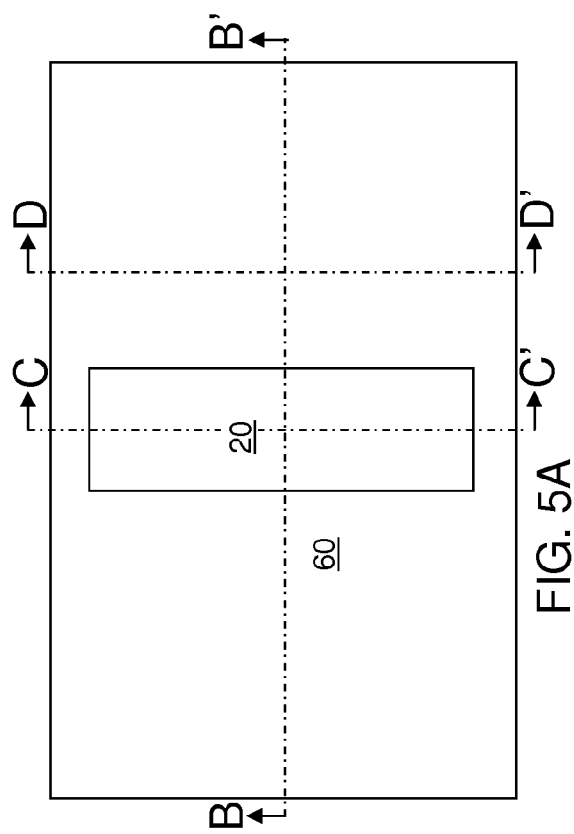
FIG. 5A
FIG. 5B
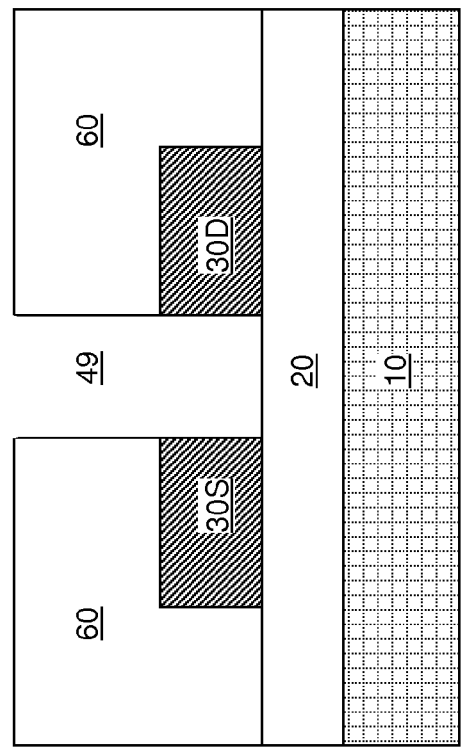

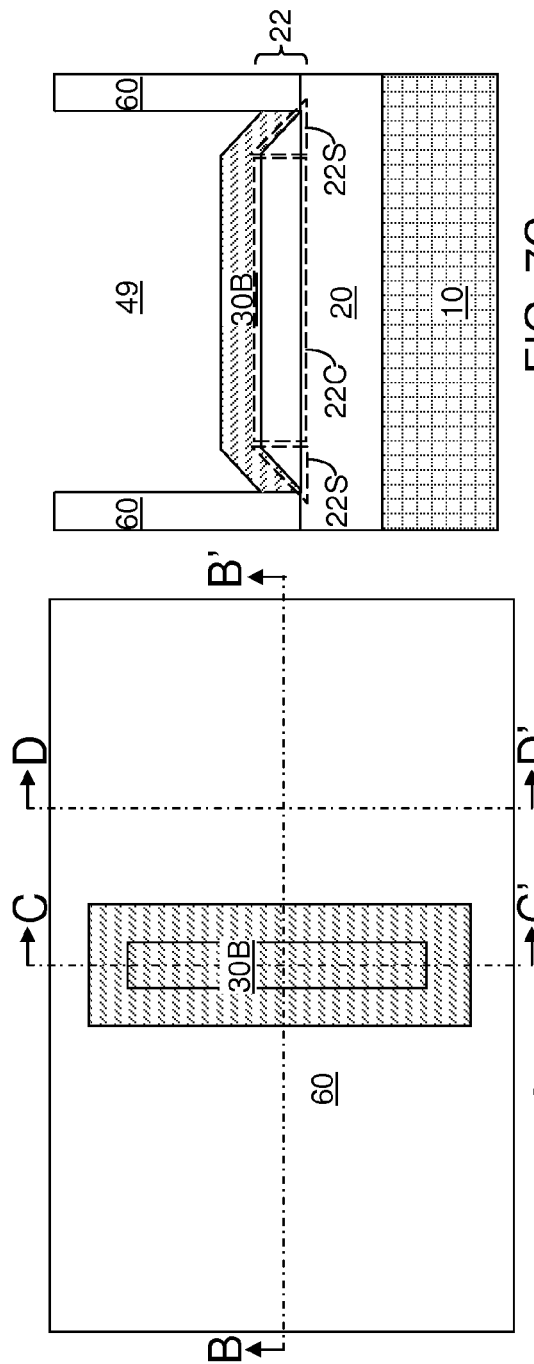
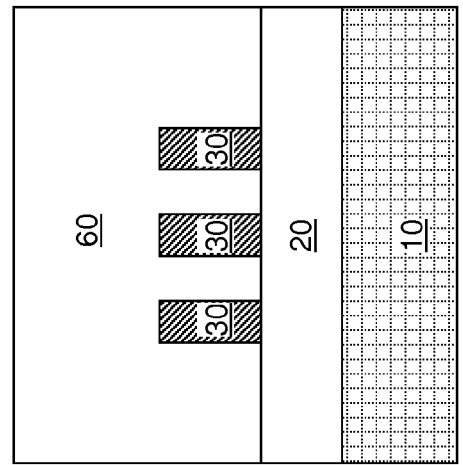
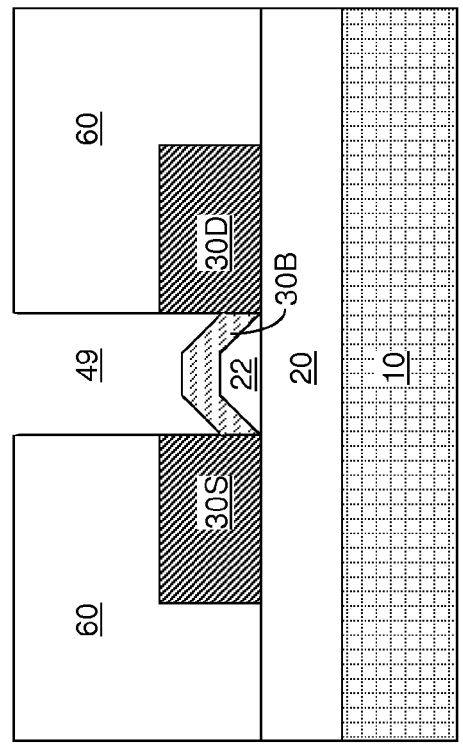
FIG. 7A
FIG. 7B
FIG. 7C
FIG. 7D

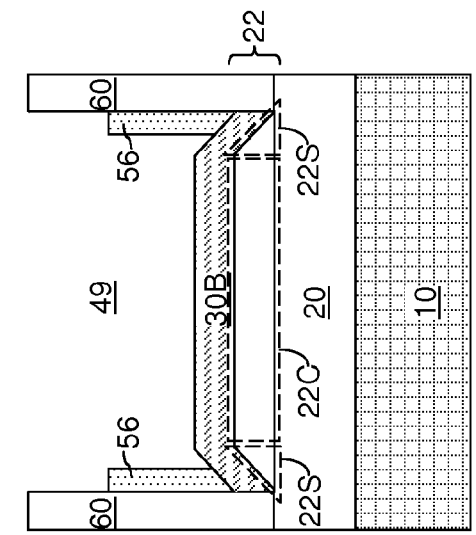
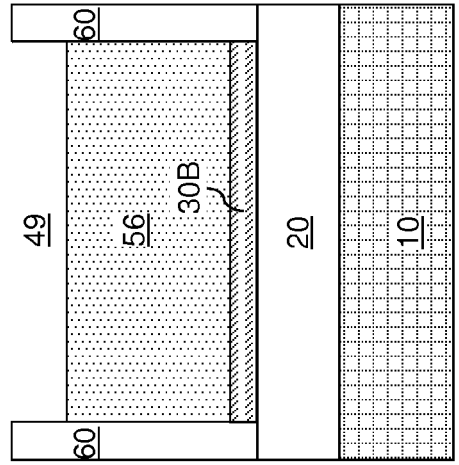
FIG. 8C
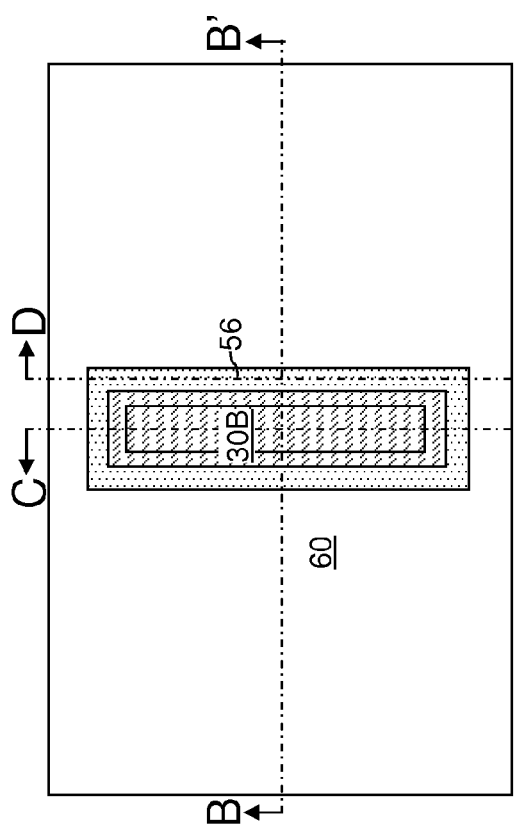
FIG. 8A
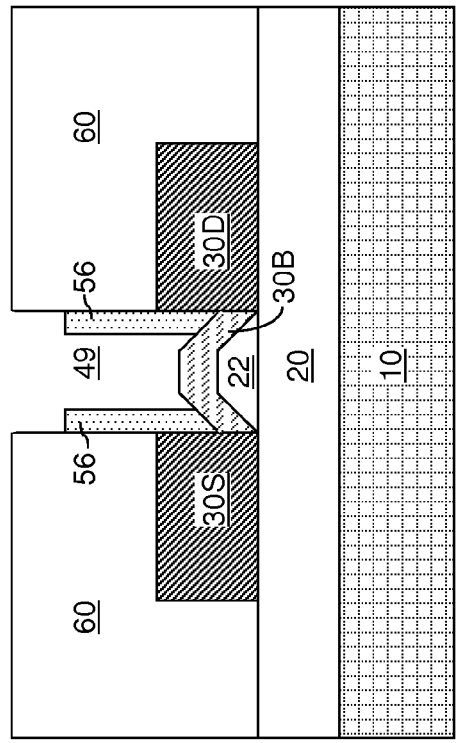
FIG. 8B
FIG. 8D

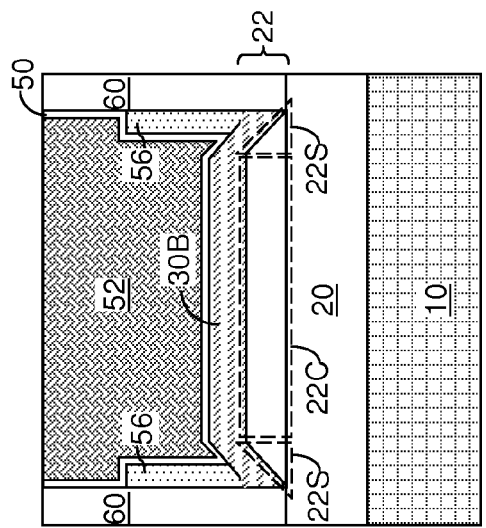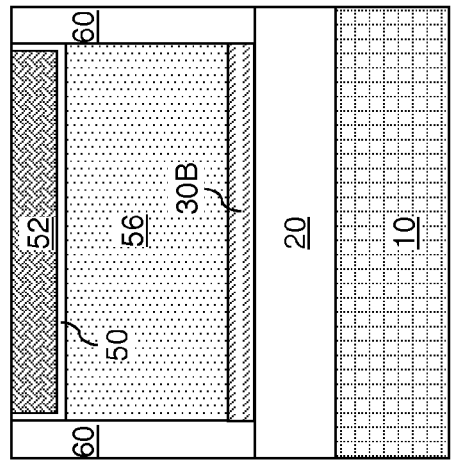
FIG. 9C
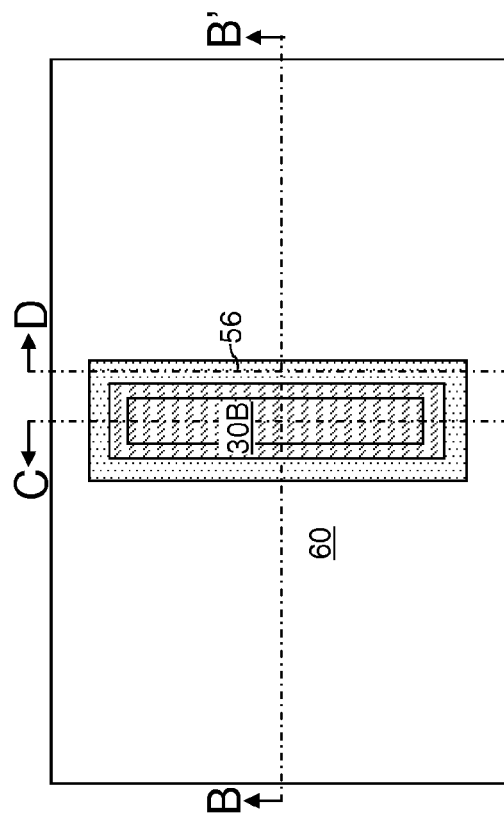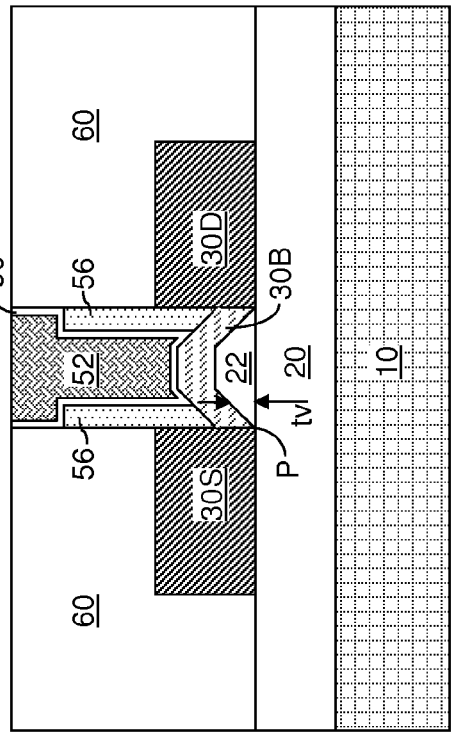
FIG. 9A
FIG. 9B
FIG. 9D

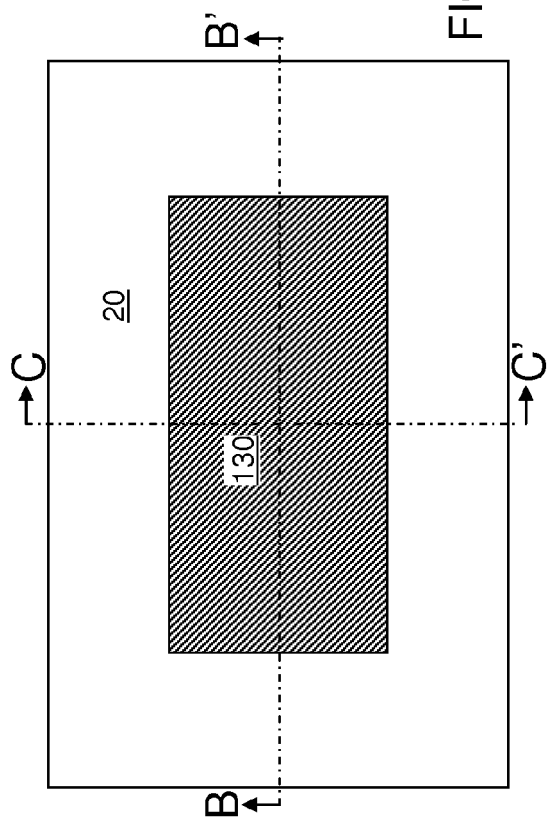
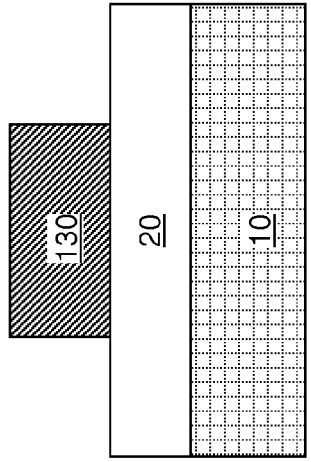
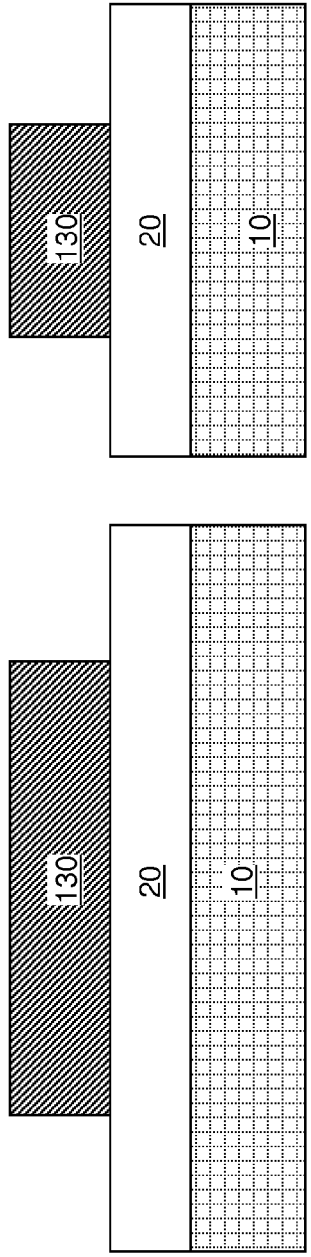
FIG. 10A
FIG. 10B
FIG. 10C

FIELD EFFECT TRANSISTOR INCLUDING A REGROWN CONTOURED CHANNEL

BACKGROUND

The present disclosure relates to a semiconductor structure, and particularly to a field effect transistor including a regrown contoured channel and a method of manufacturing the same.

Extremely thin semiconductor on insulator (ETSOI) devices have drawn attention for their enhanced electrostatic properties. At tight gate pitches and aggressively scaled gate lengths, short channel effects and multiple threshold voltages can be problems for field effect transistors including multiple channels.

SUMMARY

At least one doped semiconductor material region is formed over a crystalline insulator layer. A disposable gate structure and a planarization dielectric layer laterally surrounding the disposable gate structure are formed over the at least one doped semiconductor material region. The disposable gate structure is removed selective to the planarization dielectric layer to form a gate cavity. Portions of the at least one doped semiconductor material region are removed from underneath the gate cavity. Remaining portions of the at least one doped semiconductor material region constitute a source region and a drain region. A faceted crystalline dielectric material portion is grown from a physically exposed surface of the crystalline insulator layer. A contoured channel region is epitaxially grown on the faceted crystalline dielectric material portion. The contoured channel region increases the distance that charge carriers travel relative to a separation distance between the source region and the drain region, thereby reducing the short channel effect and variations in the threshold voltage.

According to an aspect of the present disclosure, a semiconductor structure is provided. The semiconductor structure includes at least one source region located on an insulator layer, at least one drain region located on the insulator layer, and a faceted dielectric material portion located on the insulator layer and having a variable thickness. The variable thickness increases with a lateral distance from a periphery of the faceted dielectric material portion at peripheral sub-portions of the faceted dielectric material portion that adjoin the at least one source region or the at least one drain region. The semiconductor structure further includes a channel region including a semiconductor material and laterally contacting the at least one source region and the at least one drain region, a gate dielectric having a bottommost surface that contacts the top surface of the contoured channel region, and a gate electrode vertically spaced from the contoured channel region by the gate dielectric.

According to another aspect of the present disclosure, a method of forming a semiconductor structure is provided. At least one semiconductor material portion is formed on an insulator layer. A disposable gate structure is formed over the at least one semiconductor material portion. A dielectric material layer is formed over the at least one semiconductor material portion and around the disposable gate structure. A gate cavity is formed by removing the disposable gate structure. Each of the at least one semiconductor material portion is separated into a source region and a drain region by etching each sub-portion of the at least one semiconductor material portion from underneath the gate cavity. The gate cavity is extended during this process. A faceted dielectric material portion is grown on the insulator layer within the gate cavity. The faceted dielectric material portion has a variable thickness that increases with a lateral distance from a periphery of the faceted dielectric material portion at peripheral sub-portions of the faceted dielectric material portion that adjoin the at least one source region or the at least one drain region. A channel region including a semiconductor material is grown from a top surface of the faceted dielectric material portion within the gate cavity. A gate dielectric and a gate electrode are formed on the contoured channel region and within the gate cavity.

BRIEF DESCRIPTION OF SEVERAL VIEWS OF THE DRAWINGS

FIG. 4A is a top-down view of the first exemplary semiconductor structure after formation of a gate cavity by removal of the disposable gate structure according to the first embodiment of the present disclosure.

FIG. 4B is a vertical cross-sectional view of the first exemplary semiconductor structure along the vertical plane B-B' in FIG. 4A.

FIG. 4C is a vertical cross-sectional view of the first exemplary semiconductor structure along the vertical plane C-C' in FIG. 4A.

FIG. 5A is a top-down view of the first exemplary semiconductor structure after removal of physically exposed portions of the semiconductor fins from underneath the gate cavity according to the first embodiment of the present disclosure.

FIG. 5B is a vertical cross-sectional view of the first exemplary semiconductor structure along the vertical plane B-B' in FIG. 5A.

FIG. 5C is a vertical cross-sectional view of the first exemplary semiconductor structure along the vertical plane C-C' in FIG. 5A.

FIG. 5D is a vertical cross-sectional view of the first exemplary semiconductor structure along the vertical plane D-D' in FIG. 5A.

FIG. 7A is a top-down view of the first exemplary semiconductor structure after formation of a contoured channel region by selective epitaxy according to the first embodiment of the present disclosure.

FIG. 7B is a vertical cross-sectional view of the first exemplary semiconductor structure along the vertical plane B-B' in FIG. 7A.

FIG. 7C is a vertical cross-sectional view of the first exemplary semiconductor structure along the vertical plane C-C' in FIG. 7A.

FIG. 7D is a vertical cross-sectional view of the first exemplary semiconductor structure along the vertical plane D-D' in FIG. 7A.

FIG. 8A is a top-down view of the first exemplary semiconductor structure after formation of a gate spacer according to the first embodiment of the present disclosure.

FIG. 8B is a vertical cross-sectional view of the first exemplary semiconductor structure along the vertical plane B-B' in FIG. 8A.

FIG. 8C is a vertical cross-sectional view of the first exemplary semiconductor structure along the vertical plane C-C' in FIG. 8A.

FIG. 8D is a vertical cross-sectional view of the first exemplary semiconductor structure along the vertical plane D-D' in FIG. 8A.

FIG. 9A is a top-down view of the first exemplary semiconductor structure after formation of a gate dielectric and a gate electrode according to the first embodiment of the present disclosure.

FIG. 9B is a vertical cross-sectional view of the first exemplary semiconductor structure along the vertical plane B-B' in FIG. 9A.

FIG. 9C is a vertical cross-sectional view of the first exemplary semiconductor structure along the vertical plane C-C' in FIG. 9A.

FIG. 9D is a vertical cross-sectional view of the first exemplary semiconductor structure along the vertical plane D-D' in FIG. 9A.

FIG. 10A is a top-down view of a second exemplary semiconductor structure after formation of a semiconductor material portion according to a second embodiment of the present disclosure.

FIG. 10B is a vertical cross-sectional view of the second exemplary semiconductor structure along the vertical plane B-B' in FIG. 10A.

FIG. 10C is a vertical cross-sectional view of the second exemplary semiconductor structure along the vertical plane C-C' in FIG. 10A.

DETAILED DESCRIPTION

Figure 1C:
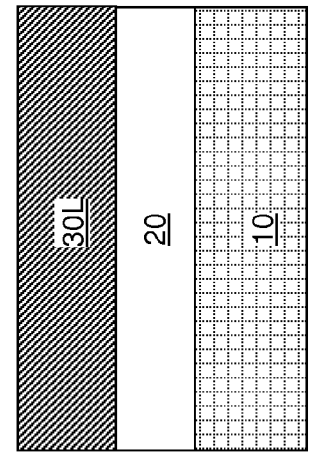
FIG. 1C is a vertical cross-sectional view of the first exemplary semiconductor structure along the vertical plane C-C' in FIG. 1A.

As stated above, the present disclosure relates to a field effect transistor including a regrown contoured channel and a method of manufacturing the same. Aspects of the present disclosure are now described in detail with accompanying figures. It is noted that like reference numerals refer to like elements across different embodiments. The drawings are not necessarily drawn to scale.

Figure 1A:
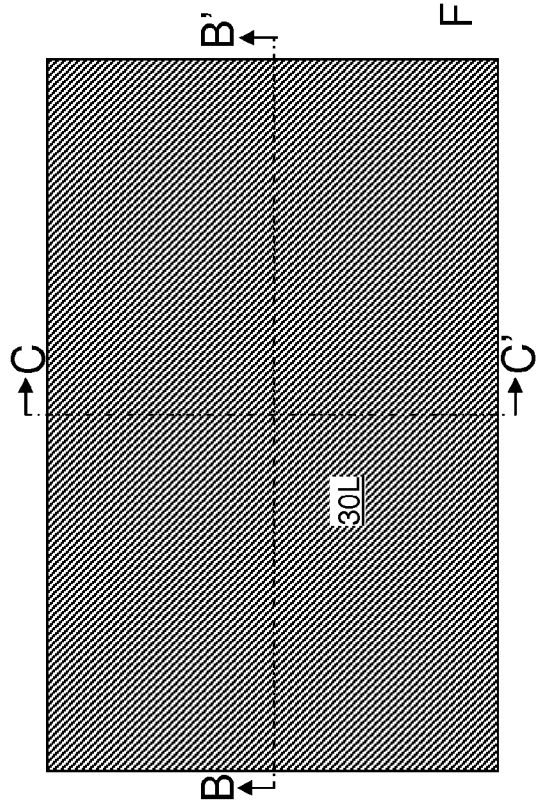
FIG. 1A is a top-down view of a first exemplary semiconductor structure upon providing a stack of a substrate, and insulator layer, and a single crystalline compound semiconductor material layer according to a first embodiment of the present disclosure.
Figure 1B:
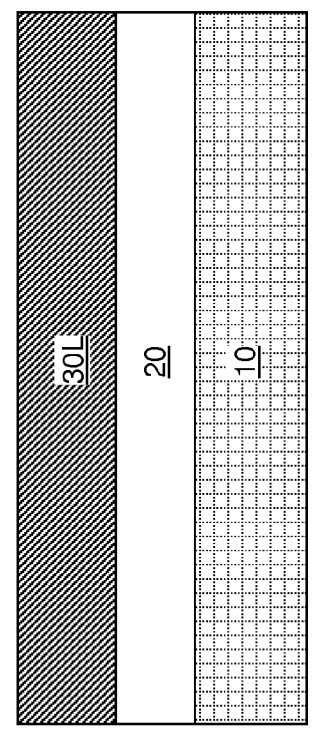
FIG. 1B is a vertical cross-sectional view of the first exemplary semiconductor structure along the vertical plane B-B' in FIG. 1A.

Referring to FIGS. 1A-1C, a first exemplary semiconductor structure according to an embodiment of the present disclosure includes a substrate 10, an insulator layer 20, a single crystalline compound semiconductor material layer 30L. The substrate 10 can be an insulator substrate, a conductive substrate, or a semiconducting substrate. In one embodiment, the substrate 10 can be a semiconductor substrate including silicon, germanium, a silicon-germanium alloy, a graded III-V compound semiconductor material, or combinations thereof. In one embodiment, the substrate 10 can include a single crystalline material on which the insulator layer 20 can be formed as a single crystalline material, for example, by epitaxial deposition. In one embodiment, the substrate 10 can be a single crystalline silicon substrate with a graded III-V compound material layer thereupon, or can be a single crystalline InP substrate.

The insulator layer 20 can be a single crystalline insulator layer including a single crystalline compound insulator material. As used herein, an insulator material refers to a material having a resistivity greater than $1.0 \times 10^3$ Ohm-cm. As used herein, a dielectric material refers to an insulator material. As used herein, a compound insulator material refers to an insulator material that includes a compound of at least two elements. The compound insulator material can be a III-V compound including a Group III element and a Group V element, or can be a II-V compound including a Group II element and a Group VI element. As used herein, a single crystalline compound insulator material refers to a compound insulator material that is single crystalline, i.e., having an epitaxial alignment among atoms throughout the entirety of the compound insulator material. In one embodiment, the single crystalline compound insulator material of the insulator layer 20 can be gallium arsenide.

In one embodiment, the insulator layer 20 can include a rare-earth oxide material, which is an oxide material of a rare-earth element. Rare earth elements are also referred to as Lanthanides, and include La, Ce, Pr, Nd, Pm, Sm, Eu, Gd, Tb, Dy, Ho, Er, Tm, Yb, and Lu. The ionic radii of rare earth elements decrease gradually with the atomic number, and the total variation of the ionic radii of rare earth elements is less than 15% among one another. The rare earth elements form various single crystalline dielectric oxides with a valance of +3, i.e., a dielectric oxide having a chemical formula of $M_2O_3$, in which M can be any of the rare earth elements.

Crystalline rare earth oxides are lattice coincident on a class of elemental or alloyed single crystalline semiconductor materials including single crystalline silicon, a single crystalline silicon-germanium alloy, a single crystalline silicon-carbon alloy, and a single crystalline silicon-germanium-carbon alloy. For each single crystalline $M_2O_3$ in which M is a rare earth element, at least one single crystalline semiconductor material having a lattice constant that is one half the lattice constant of the single crystalline $M_2O_3$ exists among single crystalline silicon, a single crystalline silicon-germanium alloy, a single crystalline silicon-carbon alloy, and a single crystalline silicon-germanium-carbon alloy.

For example, twice the lattice constant of silicon is between the lattice constant of gadolinium oxide ($Gd_2O_3$) and the lattice constant of neodymium oxide ($Nd_2O_3$). Thus, the composition of a single crystalline alloy of gadolinium oxide and neodymium oxide can be selected to match twice the lattice constant of silicon. In other words, the value x in the compound $Gd_{2-x}Nd_xO_3$ can be selected to provide a single crystalline compound having a lattice constant that is twice the lattice constant of silicon.

In another example, twice the lattice constant of germanium is between the lattice constant of praseodymium oxide ($Pd_2O_3$) and the lattice constant of lanthanum oxide ($La_2O_3$). Thus, the composition of a single crystalline alloy of praseodymium oxide and lanthanum oxide can be selected to match twice the lattice constant of germanium. In other words, the value y in the compound $Pd_{2-y}La_yO_3$ can be selected to provide a single crystalline compound having a lattice constant that is twice the lattice constant of silicon.

In one embodiment, the substrate 10 can include single crystalline silicon, single crystalline germanium, or a single crystalline silicon-germanium alloy, and the insulator layer 20 can be formed with a single crystalline insulator layer with epitaxial alignment to the single crystalline structure of the substrate 10. In one embodiment, the insulator layer 20 can include a single crystalline rare earth oxide selected from $Er_2O_3$, $Gd_2O_3$, $Nd_2O_3$, $Pr_2O_3$, $La_2O_3$, and a single crystalline alloy thereof.

In addition, crystalline rare earth oxides are lattice coincident on various single crystalline semiconductor materials that include III-V compound semiconductor materials and II-VI compound semiconductor materials. Thus, for each single crystalline $M_2O_3$ in which M is a rare earth element, at least one single crystalline compound semiconductor material having a lattice constant that is one half the lattice constant of the single crystalline $M_2O_3$ exists.

By selecting a rare-earth oxide material that is an oxide of a single rare-earth element or an oxide of an alloy of at least two rare-earth elements, the material of the insulator layer 20 can be lattice matched to, and epitaxially aligned to, the underlying single crystalline material within the substrate 10. Method of forming a single crystalline rare-earth oxide material is described, for example, in U.S. Pat. Nos. 7,655,327 and 7,709,826 to Atanackovic.

The single crystalline compound semiconductor material layer 30L includes a single crystalline compound semiconductor material in epitaxial alignment with the single crystalline compound insulator material of the insulator layer 20. As used herein, a semiconducting material refers to a material having a resistivity less than $1.0 \times 10^3$ Ohm-cm and greater than $1.0 \times 10^{-3}$ Ohm-cm. As used herein, a semiconductor material refers to a material that can have a resistivity less than $1.0 \times 10^3$ Ohm-cm and greater than $1.0 \times 10^{-3}$ Ohm-cm upon suitable doping, i.e., can become a semiconducting material upon suitable doping. As used herein, a compound semiconductor material refers to a semiconductor material that includes a compound of at least two elements. The thickness of the single crystalline compound semiconductor material layer 30L can be in a range from 10 nm to 200 nm, although lesser and greater thicknesses can also be employed.

The single crystalline compound semiconductor material of the single crystalline compound semiconductor material layer 30L can be formed by epitaxial deposition with in-situ doping with electrical dopants. The electrical dopants can be p-type dopants or n-type dopants. The conductivity type of the single crystalline compound semiconductor material layer 30L is herein referred to as a first conductivity type. In one embodiment, the dopant concentration of the first conductivity type dopants within the single crystalline compound semiconductor material layer 30L can be in a range from $1.0 \times 10^{19}/cm^3$ to $5.0 \times 10^{21}/cm^3$, although lesser and greater dopant concentrations can also be employed. In one embodiment, the resistivity of the single crystalline compound semiconductor material layer 30L can be greater than $1.0 \times 10^{-5}$ Ohm-cm and less than $1.0 \times 10^{-2}$ Ohm-cm. In another embodiment, the single crystalline compound semiconductor material layer 30L can be conductive, and have a resistivity greater than $3.0 \times 10^{-5}$ Ohm-cm and less than $1.0 \times 10^{-3}$ Ohm-cm. As used herein, a material is conductive if the conductivity of the material is less than $1.0 \times 10^{-3}$ Ohm-cm.

Alternately or additionally, the single crystalline compound semiconductor material of the single crystalline compound semiconductor material layer 30L can be formed by epitaxial deposition and ion implantation of electrical dopants of the first conductivity type. The implanted electrical dopants can be electrically activated by an anneal at an elevated temperature, which can be in a range from 600 degree Celsius to 1,000 degree Celsius.

The single crystalline compound semiconductor material of the single crystalline compound semiconductor material layer 30L is in epitaxial alignment with the single crystalline compound insulator material of the insulator layer 20. In one embodiment, the single crystalline compound semiconductor material layer 30L can be formed by epitaxial deposition of the single crystalline compound semiconductor material upon the insulator layer 20. In one embodiment, metal organic chemical vapor deposition (MOCVD) can be employed to deposit the single crystalline compound semiconductor material layer 30L with epitaxial alignment to the insulator layer 20. In one embodiment, the single crystalline compound semiconductor material can be InGaAs.

Figure 2A:
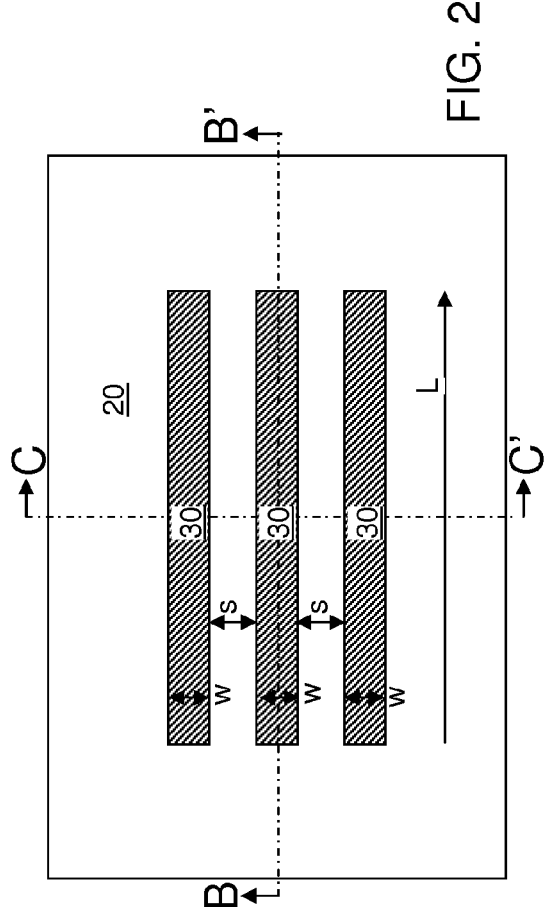
FIG. 2A is a top-down view of the first exemplary semiconductor structure after formation of semiconductor fins on a crystalline insulator layer according to the first embodiment of the present disclosure.
Figure 2B:
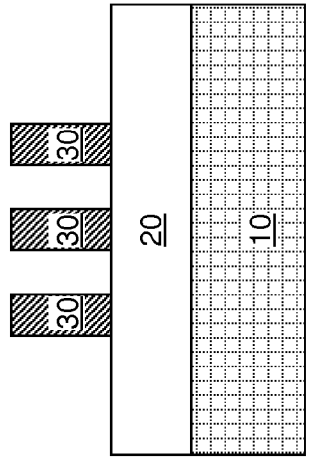
FIG. 2B is a vertical cross-sectional view of the first exemplary semiconductor structure along the vertical plane B-B' in FIG. 1A.
Figure 2C:
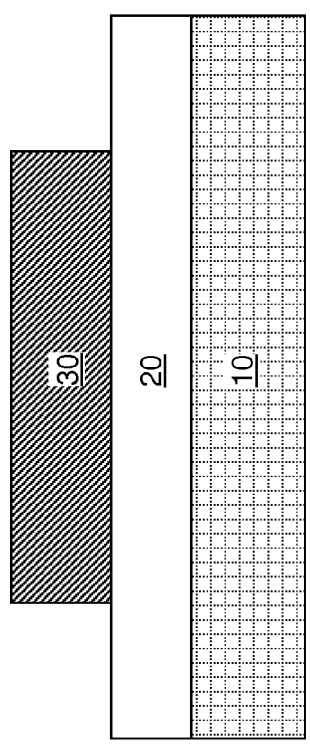
FIG. 2C is a vertical cross-sectional view of the first exemplary semiconductor structure along the vertical plane C-C' in FIG. 1A.

Referring to FIGS. 2A-2C, at least one semiconductor material portion is formed on the insulator layer 20. Each of the at least one semiconductor material portion can be single crystalline, and can be epitaxially aligned to a crystallographic structure of the insulator layer 20.

In one embodiment, each of the at least one semiconductor material portion can be a semiconductor fin 30 having a pair of parallel vertical sidewalls. In one embodiment, the single crystalline compound semiconductor material layer 30L can be patterned to form a plurality of semiconductor fins 30. For example, a photoresist layer (not shown) can be applied over the single crystalline compound semiconductor material layer 30L. The photoresist layer is patterned by lithographic exposure and development to cover portions of the single crystalline compound semiconductor material layer 30L. The pattern in the photoresist layer can be selected such that the horizontal cross-sectional shapes of the patterned photoresist layer include parallelograms. In one embodiment, the horizontal cross-sectional shapes of the patterned photoresist layer include rectangular shapes each having a pair of lengthwise edges. As used herein, a lengthwise edge of a rectangle is an edge that is not a shortest edge. In one embodiment, the horizontal cross-sectional shapes of the patterned photoresist layer include a plurality of rectangular shapes having lengthwise edges that extend along a same horizontal direction, which is herein referred to as a lengthwise direction L.

The pattern in the photoresist layer can be transferred into the single crystalline compound semiconductor material layer 30L by an anisotropic etch to pattern the single crystalline compound semiconductor material layer 30L. A plurality of semiconductor fins 30 is formed on the top surface of the insulator layer 20 by remaining portions of the single crystalline compound semiconductor material layer 30L. The photoresist layer is subsequently removed, for example, by ashing.

Each of the plurality of semiconductor fins 30 can include the single crystalline compound semiconductor material, and can be epitaxially aligned to the single crystalline compound insulator material of the insulator layer 20. Each of the plurality of semiconductor fins 30 can have a pair of vertical sidewalls laterally extending along the lengthwise direction L. In one embodiment, each of the plurality of semiconductor fins 30 can have a width w throughout the entirety thereof. Thus, a pair of sidewalls of each semiconductor fin 30 can extend along the lengthwise direction L with a separation distance of the width w. In one embodiment, each of the plurality of semiconductor fins 30 can be laterally spaced from a neighboring semiconductor fin 30 by a spacing s.

Figure 3A:
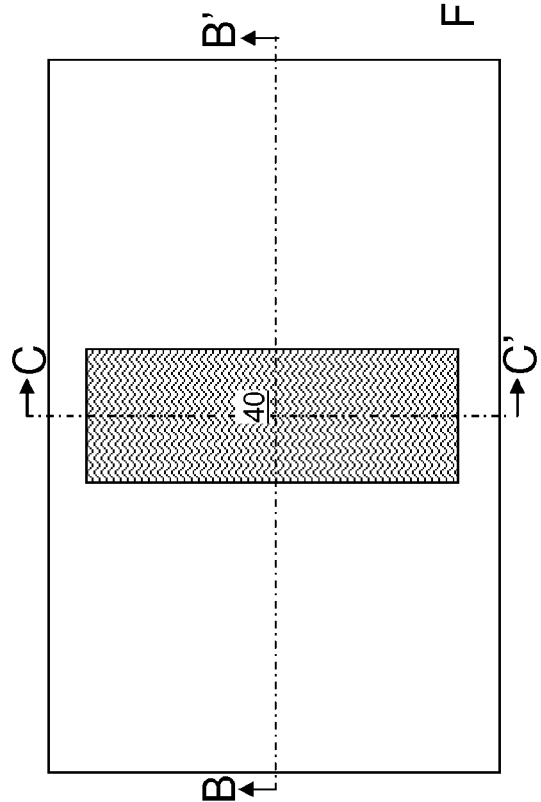
FIG. 3A is a top-down view of the first exemplary semiconductor structure after formation of a disposable gate structure and a planarization dielectric layer according to the first embodiment of the present disclosure.
Figure 3C:
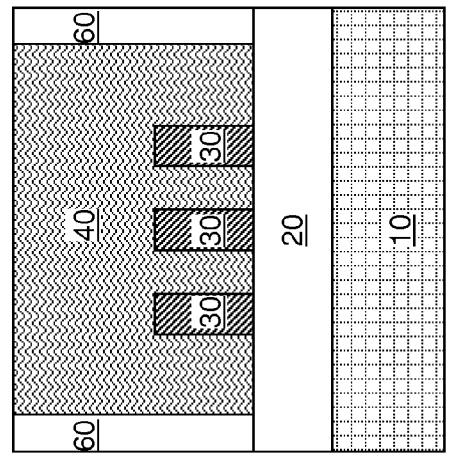
FIG. 3C is a vertical cross-sectional view of the first exemplary semiconductor structure along the vertical plane C-C' in FIG. 3A.
Figure 3B:
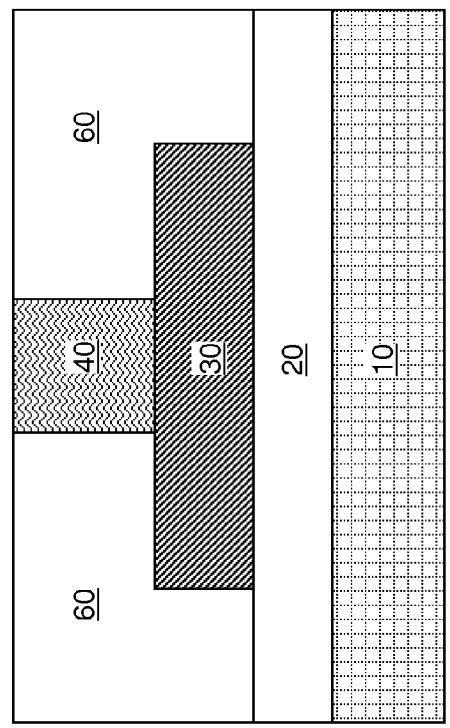
FIG. 3B is a vertical cross-sectional view of the first exemplary semiconductor structure along the vertical plane B-B' in FIG. 3A.
Figure 6A:
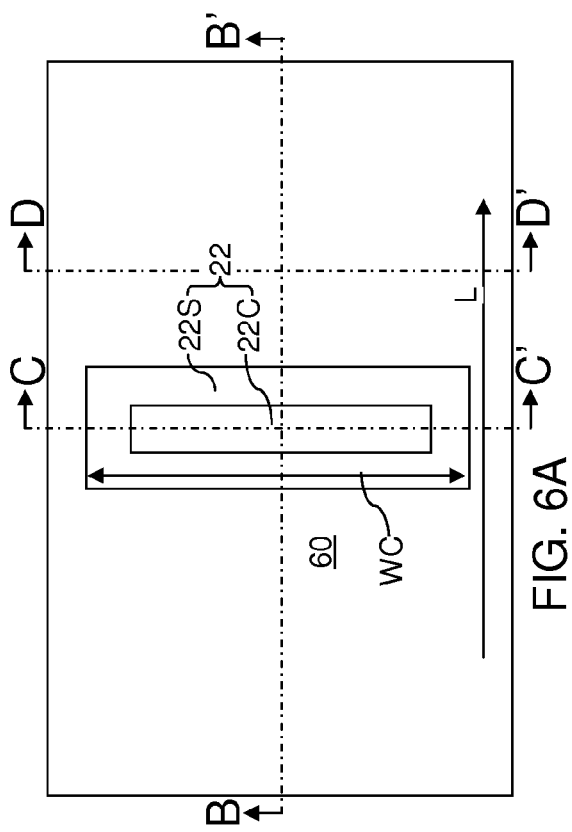
FIG. 6A is a top-down view of the first exemplary semiconductor structure after formation of a faceted dielectric material portion by selective epitaxy according to the first embodiment of the present disclosure.
Figure 6C:
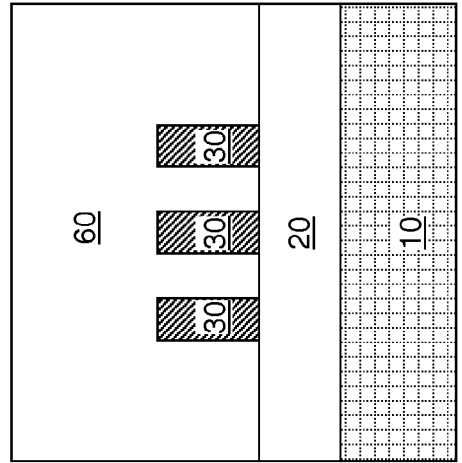
FIG. 6C is a vertical cross-sectional view of the first exemplary semiconductor structure along the vertical plane C-C' in FIG. 6A.
Figure 6B:
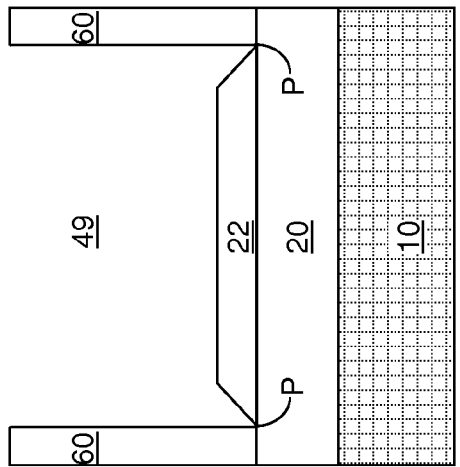
FIG. 6B is a vertical cross-sectional view of the first exemplary semiconductor structure along the vertical plane B-B' in FIG. 6A.
Figure 6D:
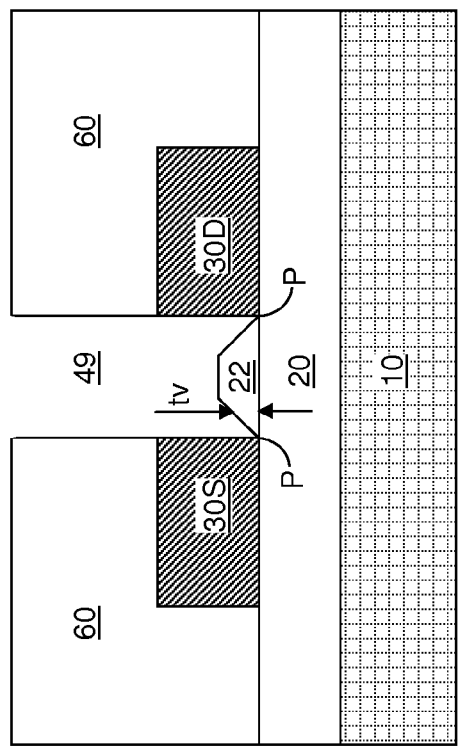
FIG. 6D is a vertical cross-sectional view of the first exemplary semiconductor structure along the vertical plane D-D' in FIG. 6A.
Figure 11A:
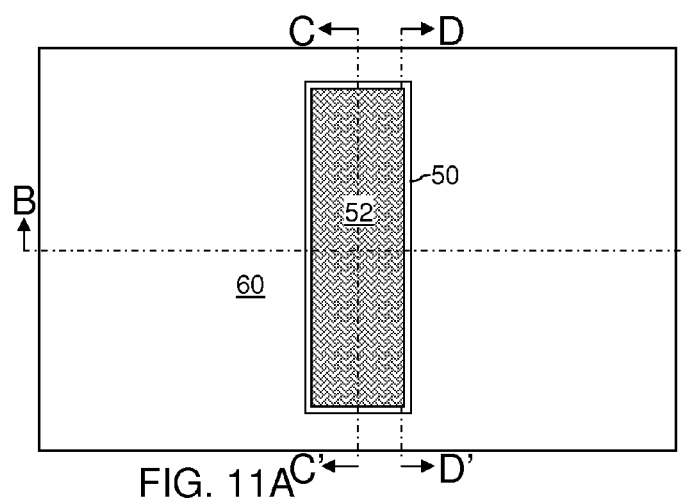
FIG. 11A is a top-down view of the second exemplary semiconductor structure after formation of a gate dielectric and a gate electrode according to the second embodiment of the present disclosure.
Figure 11C:
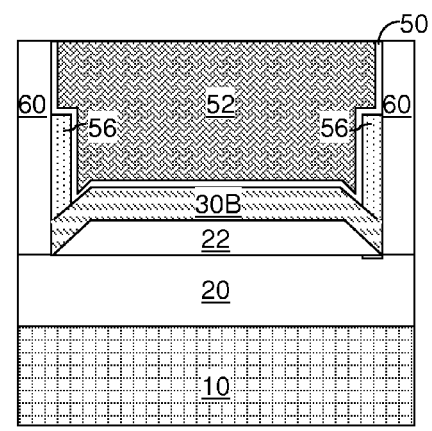
FIG. 11C is a vertical cross-sectional view of the exemplary semiconductor structure along the vertical plane C-C' in FIG. 11A.
Figure 11B:
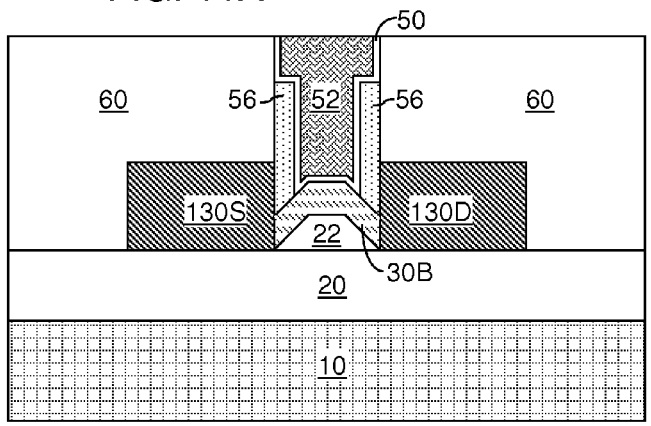
FIG. 11B is a vertical cross-sectional view of the exemplary semiconductor structure along the vertical plane B-B' in FIG. 11A.
Figure 11D:
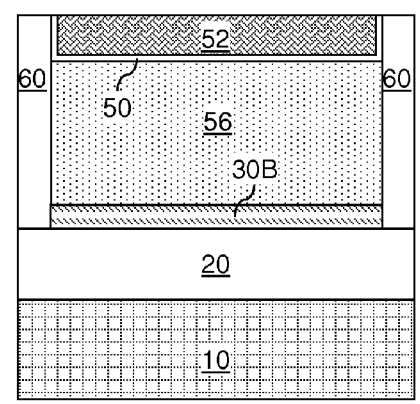
FIG. 11D is a vertical cross-sectional view of the exemplary semiconductor structure along the vertical plane D-D' in FIG. 11A.

Referring to FIGS. 3A-3C, a disposable gate structure 40 is formed across the at least one semiconductor material portion such as the plurality of semiconductor fins 30. For example, a disposable material layer is deposited over the plurality of semiconductor fins 30 and the insulator layer, and is patterned to form the disposable gate structure 40. The patterning of the disposable material layer can be performed, for example, by application and patterning of a photoresist layer over the disposable material layer, and transfer of the pattern in the photoresist layer into the disposable material layer by an etch that employs the patterned photoresist layer as an etch mask. A remaining portion of the disposable material layer constitutes the disposable gate structure 40.

The disposable gate structure 40 straddles the plurality of semiconductor fins 30. The disposable gate structure 40 includes a material that can be removed selective to the single crystalline compound semiconductor material of the single crystalline compound semiconductor material layer 30L. For example, the disposable gate structure 40 can include a dielectric material such as organosilicate glass, silicon nitride, amorphous carbon, or a combination thereof. Alternately, the disposable gate structure 40 can include a semiconductor material that is different from the single crystalline compound semiconductor material of the single crystalline compound semiconductor material layer 30L. For example, the disposable gate structure 40 can include germanium or silicon.

A planarization dielectric layer 60 is deposited conformally over the plurality of semiconductor fins 30 and the disposable gate structure 40. For example, a planarizable dielectric material, i.e., a dielectric material that can be planarized, is conformally deposited, and is subsequently planarized. The planarization dielectric layer 60 can be planarized, for example, by chemical mechanical planarization (CMP). The top surface of the disposable gate structure 40 can be employed as a stopping surface during planarization of the planarization dielectric layer 60. The top surface of the planarization dielectric layer 60 can be coplanar with the top surface of the remaining portion of the disposable gate structure 40. The planarization dielectric layer 60 can include a dielectric material such a borosilicate glass (BSG), borophosphosilicate glass (BPSG), fluorosilicate glass (FSG), a porous or non-porous organosilicate glass (OSG), or silicon nitride. The planarization dielectric layer 60 is formed around the disposable gate structure 40, and embeds the disposable gate structure 40 and the plurality of semiconductor fins 30.

Referring to FIGS. 4A-4C, the disposable gate structure 40 is removed selective to the materials of the planarization dielectric layer 60 and the plurality of semiconductor fins 30 by an etch, which can be a wet etch or a dry etch. A gate cavity 49 is formed in the volume from which the disposable gate structure 40 is removed. The surfaces of the planarization dielectric layer 60 are amorphous surfaces.

Referring to FIGS. 5A-5D, physically exposed portions of the at least one semiconductor material portion (such as the plurality of semiconductor fins 30) are removed from underneath the gate cavity 49 by an anisotropic etch that employs the planarization dielectric layer 60 as an etch mask. The gate cavity is extended to include the volumes of the removed portions of the at least one semiconductor material portion. The anisotropic etch can be selective to the material of the insulator layer 20.

Each of the at least one semiconductor material portion is separated into a source region 30S and a drain region 30D by etching each sub-portion of the at least one semiconductor material portion from underneath the gate cavity 49. In one embodiment, each of the plurality of semiconductor fins 30 is separated into a source region 30S and a drain region 30D. After formation of the at least one source region 30S and the at least one drain region 30D, all sidewalls of the gate cavity 49 can be vertical, and can extend from the top surface of the insulator layer 20 to a top surface of the planarization dielectric layer 60. A sidewall of each source region 30S can be vertically coincident with a sidewall of the planarization dielectric layer 60. As used herein, a first surface is vertically coincident with a second surface if there exists a vertical plane that includes the first surface and the second surface. A sidewall of each drain region 30D can be vertically coincident with a sidewall of the planarization dielectric layer 60.

Referring to FIGS. 6A-6D, a faceted dielectric material portion 22 can be formed by selective epitaxy of a dielectric material on the physically exposed surfaces of the insulator layer 20 within the gate cavity 49. The faceted dielectric material portion 22 includes a single crystalline dielectric material that grows from the top surface of the insulator layer 20, and includes crystallographic facets at the surfaces thereof. In one embodiment, all top surfaces of the faceted dielectric material portion 22 can be crystallographic facets. The single crystalline dielectric material of the faceted dielectric material portion 22 can be epitaxially aligned to the crystallographic structure of the single crystalline insulator material of the insulator layer 20.

The faceted dielectric material portion 22 includes angled facets along a periphery of the gate cavity 49, and may optionally include a region having a uniform thickness at a center portion, i.e., a region in which the facet is parallel to the top surface of the insulator layer 20. The portions of the faceted dielectric material portion 22 that include angled facets are herein referred to as peripheral sub-portions 22S of the faceted dielectric material portion 22, and the region having a uniform thickness is herein referred to as a uniform-thickness sub-portion 22C. The peripheral sub-portions 22S of the faceted dielectric material portion 22 have a variable thickness vt that increases with a lateral distance from a periphery P of the faceted dielectric material portion 22. The peripheral sub-portions 22S of the faceted dielectric material portion 22 adjoin the at least one source region 30S or the at least one drain region 30D, and can be ring-shaped and laterally surround the uniform-thickness sub-portion 22C.

In one embodiment, the faceted dielectric material portion 22 can include a single crystalline rare-earth oxide material. The rare-earth oxide material of the faceted dielectric material portion 22 can be the same as, or can be different from, the dielectric material of the insulator layer 20. In one embodiment, the faceted dielectric material portion 22 and the dielectric layer 20 can include rare-earth oxide materials. The faceted dielectric material portion 22 and the dielectric layer 20 may include the same rare-earth oxide material, or may include different rare-earth oxide materials.

In one embodiment, the selective epitaxy process can provide growth of the single crystalline dielectric material from the top surface of the insulator layer 20 while suppressing growth of the single crystalline dielectric material from surfaces of the at least one source region 30S and the at least one drain region 30D. For example, the orientations of the plurality of semiconductor fins 30 (See FIGS. 2A-2C) can be selected such that the physically exposed sidewall surfaces of the at least one source region 30S and the at least one drain region 30D within the gate cavity 49 can be {110} surface orientations, and the surface orientation of the physically exposed top surface of the insulator layer 20 within the gate cavity can have a (001) surface orientation. In this case, the deposition rate of a single crystalline compound dielectric material can be greater on the top surface of the insulator layer 20 having the (001) surface orientation than on the sidewall surfaces having {110} surface orientations. The ratio of the reactant flow to the etchant flow during the selective epitaxy process, deposition of the single crystalline dielectric material of the faceted dielectric material portion 22 can proceed only vertically from the top surface of the insulator layer 20, and growth of a dielectric material from the sidewalls of the at least one source region 30S and the at least one drain region 30D can be suppressed.

The thickness of the uniform-thickness sub-portion 22C of the faceted dielectric material portion 22 is less than the height of the at least one source region 30S and the at least one drain region 30D. Upon termination of growth of the faceted dielectric material portion 22, a top surface of the faceted dielectric material portion 22 is more proximal to the top surface of the insulator layer 20 than top surfaces of the at least one source region 30S and the at least one drain region 30D are to the top surface of the insulator layer 20. The thickness of the uniform-thickness sub-portion 22C of the faceted dielectric material portion 22 can be in a range from 3 nm to 100 nm, although lesser and greater thicknesses can also be employed. The thickness of the uniform-thickness sub-portion 22C of the faceted dielectric material portion 22 can be optimized for device performance. The width WC of the faceted dielectric material portion 22 in the direction perpendicular to the lengthwise direction L is greater than the sum of all widths of the at least one source region 30S, or the sum of all widths of the at least one drain region 30D.

Selective deposition of a single crystalline rare-earth oxide material can be effected, for example, by modifying the deposition method of U.S. Pat. Nos. 7,655,327 and 7,709,826 to Atanackovic to provide an etchant gas, such as HCl, $NF_3$, $CF_4$, $CHF_3$, or combinations thereof into a process chamber concurrently, or alternately, with reactant gas(es) that is/are precursors for the deposited rare-earth oxide material. During the selective deposition, the single crystalline rare-earth oxide material is deposited, and grows from, only on the single crystalline semiconductor surface of the substrate 10, and does not nucleate, or grow from, the surfaces of the dielectric layer 20. In one embodiment, the faceted dielectric material portion 22 can include a single crystalline rare earth oxide material selected from single crystalline $Er_2O_3$, single crystalline $Gd_2O_3$, single crystalline $Nd_2O_3$, single crystalline $Pr_2O_3$, single crystalline $La_2O_3$, and a single crystalline alloy thereof.

Referring to FIGS. 7A-7D, a contoured channel region 30B can be formed by selective epitaxy of a semiconductor material on the physically exposed surfaces of the faceted dielectric material portion 22 within the gate cavity 49. As used herein, a region refers to a structure occupying a volume of space. As used herein, a contoured region refers to a region having a vertical cross-sectional shape that is not a parallelogram. As used herein, a contoured channel region refers a contoured region that is a channel region of a field effect transistor.

During a selective epitaxy process, the contoured channel region 30B can be grown from the top surfaces of the faceted dielectric material portion 22 within the gate cavity 49. The contoured channel region 30B includes a single crystalline semiconductor material that grows from the top surface of the faceted dielectric material portion 22. The single crystalline semiconductor material of the contoured channel region 30B can be epitaxially aligned to the crystallographic structure of the single crystalline insulator material of the insulator layer 20. In one embodiment, the contoured channel region 30B has a uniform thickness over the entirety the uniform-thickness sub-portion 20C (See FIG. 6A). The contoured channel region 30B functions as a channel of a field effect transistor. In one embodiment, the contoured channel region 30B can include a single crystalline compound semiconductor material, which can be the same as, or different from, the compound semiconductor material of the at least one source region 30S and the at least one drain region 30D. In one embodiment, the contoured channel region 30B, the at least one source region 30S, and the at least one drain region 30D can include InGaAs.

In one embodiment, top surfaces of the faceted dielectric material portion 22 can be crystallographic facets, and the top surfaces and the bottom surfaces of the contoured channel region 30B can be crystallographic surfaces. The single crystalline structure of the contoured channel region 30B can be epitaxially aligned to the single crystalline structure of the faceted dielectric material portion 22.

In one embodiment, the at least one source region 30S and the at least one drain region 30D includes a single crystalline compound semiconductor material having a doping of the first conductivity type, and the contoured channel region has a doping of a second conductivity type that is the opposite of the first conductivity type. In one embodiment, the first conductivity type is p-type and the second conductivity type is n-type. In another embodiment, the first conductivity type is n-type and the second conductivity type is p-type.

In one embodiment, the selective epitaxy process can provide growth of the single crystalline semiconductor material from the top surface of the faceted dielectric material portion 22 while suppressing growth of the single crystalline semiconductor material from surfaces of the at least one source region 30S and the at least one drain region 30D. For example, the orientations of the plurality of semiconductor fins 30 (See FIGS. 2A-2C) can be selected such that the physically exposed sidewall surfaces of the at least one source region 30S and the at least one drain region 30D within the gate cavity 49 can be {110} surface orientations, and the surface orientation of the uniform-thickness sub-portion 22C of the faceted dielectric material portion 22 within the gate cavity can have a (001) surface orientation. In this case, the deposition rate of a single crystalline compound semiconductor material can be greater on the top surface of the uniform-thickness sub-portion 22C having the (001) surface orientation than on the sidewall surfaces having {110} surface orientations. The ratio of the reactant flow to the etchant flow during the selective epitaxy process, deposition of the single crystalline compound semiconductor material of the contoured channel region 30B can proceed only vertically from the top surface of the faceted dielectric material portion 22, and growth of a compound semiconductor material from the sidewalls of the at least one source region 30S and the at least one drain region 30D can be suppressed. The deposition rate of the single crystalline compound semiconductor material on the faceted surfaces of the peripheral sub-portions 22S is non-zero during the selective epitaxy process such that the contoured channel region 30B contiguously extends from the at least one source region 30S to the at least one drain region 30D.

Upon termination of growth of the contoured channel region 30B, the top surface of the planar portion of the contoured channel region 30B is more proximal to the top surface of the insulator layer 20 than top surfaces of the at least one source region 30S and the at least one drain region 30D are to the top surfaces of the insulator layer 20. The thickness of the planar portion of the contoured channel region 30B can be in a range from 3 nm to 100 nm, although lesser and greater thicknesses can also be employed. The thickness of the planar portion of the contoured channel region 30B can be optimized for device performance. The width of the contoured channel region 30B can be the same as the width WC of the faceted dielectric material portion 22.

Referring to FIGS. 8A-8D, a gate spacer 56 can be formed within the gate cavity 49 by conformally depositing a dielectric material layer over the contoured channel region 30B, and by anisotropically etching the dielectric material layer selective to the semiconductor material of the contoured channel region 30B and the dielectric material of the planarization dielectric layer 60. The gate spacer 56 includes a dielectric material that is different from the dielectric material of the planarization dielectric layer 60. For example, the planarization dielectric layer 60 can include silicon oxide or organosilicate glass (OSG), and the gate spacer 56 can include silicon nitride. The gate spacer 56 is formed directly on sidewalls of the at least one source region 30S and the at least one drain region 30D. The thickness of the gate spacer 56 can be in a range from 1 nm to 30 nm, although lesser and greater thicknesses can also be employed.

The gate spacer 56 is formed on sidewalls of the gate cavity 49 (See FIGS. 7A-7D) after formation of the contoured channel region 30B. A vertical distance between a top surface of the contoured channel region and a top surface of the insulator layer 20 increases with a lateral distance from each sidewall of the at least one source region 30S and the at least one drain region 30D that contacts the gate spacer 56 over the peripheral sub-portions 22S of the faceted dielectric material portion 22.

Referring to FIGS. 9A-9D, a gate structure (50, 52) including a gate dielectric 50 and a gate electrode 52 can be formed to fill the gate cavity 49 (See FIGS. 8A-8D). The gate structure (50, 52) can be formed, for example, by depositing a stack of a gate dielectric layer and a gate conductor layer to fill the gate cavity 49, and by removing excess portions of the gate dielectric layer and the gate conductor layer from above the top surface of the planarization dielectric layer 60.

The gate dielectric layer can include a dielectric oxide and/or a dielectric nitride of a semiconductor material (such as silicon oxide and/or silicon nitride), and/or can include a dielectric metal oxide or a dielectric metal nitride (such as $HfO_2$, $ZrO_2$, $HfO_xN_y$, $ZrO_xN_y$) or any other high dielectric constant (high-k) gate dielectric material having a dielectric constant greater than 7.9 as known in the art. The gate dielectric layer can be formed by thermal and/or plasma oxidation, thermal and/or plasma nitridation, atomic layer deposition (ALD), chemical vapor deposition (CVD), or a combination thereof. The thickness of the gate dielectric layer can be from 1 nm to 6 nm, although lesser and greater thicknesses can also be employed. The gate conductor layer includes at least one conductive material, which can be at least one doped semiconductor material and/or at least one metallic material.

The first exemplary semiconductor structure includes at least one source region 30S located on the insulator layer 20, at least one drain region 30D located on the insulator layer 20, the faceted dielectric material portion 22 located on the insulator layer 20 and having a variable thickness tv. The variable thickness increases with a lateral distance from a periphery P of the faceted dielectric material portion 22 at peripheral sub-portions 22S of the faceted dielectric material portion 22 that adjoin the at least one source region 30S or the at least one drain region 30D. A channel region, i.e., the contoured channel region 30B, includes a single crystalline semiconductor material and laterally contacts the at least one source region 30S and the at least one drain region 30D. The gate dielectric 50 has a bottommost surface that contacts the top surface of the contoured channel region 30B. The gate electrode 52 is vertically spaced from the contoured channel region 30B by the gate dielectric 50.

In one embodiment, the faceted dielectric material portion 22 is single crystalline, and the contoured channel region 30B is single crystalline and is epitaxially aligned to the crystallographic structure of the faceted dielectric material portion 22. In one embodiment, the insulator layer 20 is single crystalline, and the faceted dielectric material portion 22 is epitaxially aligned to the crystallographic structure of the insulator layer 20. In one embodiment, the insulator layer 20 is single crystalline, and each of the at least one source region 30S and the at least one drain region 30D is single crystalline and is epitaxially aligned to the crystallographic structure of the insulator layer 20.

The gate spacer 56 laterally surrounds at least a lower portion of the gate electrode 52, and contacts sidewalls of the at least one source region 30S and the at least one drain region 30D. A portion of the gate dielectric 50 overlies the gate spacer 56, and includes outer sidewalls that are vertically coincident with outer sidewalls of the gate spacer 56. A dielectric material layer, i.e., the planarization dielectric layer 60, has a top surface that is coplanar with the top surface of the gate electrode 52. The at least one source region 30S and the at least one drain region 30D have a doping of the first conductivity type, and the contoured channel region has a doping of a second conductivity type that is the opposite of the first conductivity type.

Referring to FIGS. 10A-10C, a second exemplary semiconductor structure according to a second embodiment of the present disclosure can be derived from the first exemplary semiconductor structure of FIGS. 1A-1C by forming a contiguous semiconductor material portion 130 in lieu of a plurality of semiconductor fins 30 shown in FIGS. 2A-2C. The contiguous semiconductor material portion 130 can have a rectangular horizontal cross-sectional area, and can have a uniform height and a uniform width.

Referring to FIGS. 11A-11D, the processing steps of FIGS. 3A-3C, 4A-4C, 5A-5D, 6A-6D, 7A-7D, 8A-8D, and 9A-9D can be sequentially performed to form the second exemplary semiconductor structure illustrated in FIGS. 11A-11D. The second exemplary semiconductor structure includes a contiguous source region 130S and a contiguous drain region 130D in lieu of a plurality of source regions 30S and a plurality of drain regions 30D, respectively, in the first exemplary semiconductor structure illustrated in FIGS. 9A-9D.

The effective channel length of the contoured channel region 30B is greater than the lateral separation distance between the at least one source region 30S and the at least one drain region 30D, or the lateral separation distance between the contiguous source region 130S and the contiguous drain region 130D due to the non-linear current conduction path within the contoured channel region 30B. The effective channel length of the contoured channel region 30B is approximately the same as the combined lengths of the segments of the top surface of the contoured channel region 30B as illustrated in FIG. 9B or in FIG. 11B, or the combined lengths of the segments of the bottom surface of the contoured channel region 30B as illustrated in FIG. 9B or in FIG. 11B. In addition, because the materials of the source region(s) (30S or 130S) and the drain region(s) (30D or 130D) are formed prior to formation of the contoured planar channel region 30B and the gate electrode 52, dopant activation in the source region(s) (30S or 130S) and the drain region(s) (30D or 130D) can be performed without regard to any thermal constraint on the planar channel region 30B and the gate electrode 52. Further, the source region(s) (30S or 130S) and the drain region(s) (30D or 130D) are self-aligned to the planar channel region 30B and the gate electrode 52 with minimal diffusion of electrical dopants into the planar channel region 30B.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   at least one source region located on an insulator layer;
   at least one drain region located on said insulator layer;
   a faceted dielectric material portion located on said insulator layer and having a variable thickness, wherein said variable thickness increases with a lateral distance from a periphery of said faceted dielectric material portion at peripheral sub-portions of said faceted dielectric material portion that adjoin said at least one source region or said at least one drain region;
   a channel region including a semiconductor material and laterally contacting said at least one source region and said at least one drain region;
   a gate dielectric having a bottommost surface that contacts said top surface of said channel region; and
   a gate electrode vertically spaced from said contoured channel region by said gate dielectric.

2. The semiconductor structure of claim 1, wherein said faceted dielectric material portion is single crystalline, and said channel region is single crystalline and is epitaxially aligned to a crystallographic structure of said faceted dielectric material portion.

3. The semiconductor structure of claim 2, wherein said insulator layer is single crystalline, and said faceted dielectric material portion is epitaxially aligned to a crystallographic structure of said insulator layer.

4. The semiconductor structure of claim 1, wherein said insulator layer is single crystalline, and each of said at least one source region and said at least one drain region is single crystalline and is epitaxially aligned to a crystallographic structure of said insulator layer.

5. The semiconductor structure of claim 1, further comprising a gate spacer laterally surrounding at least a lower portion of said gate electrode and contacting sidewalls of said at least one source region and said at least one drain region.

6. The semiconductor structure of claim 5, wherein a vertical distance between a top surface of said channel region and a top surface of said insulator layer increases with a lateral distance from each sidewall of said at least one source region and said at least one drain region that contacts said gate spacer over said peripheral sub-portions of said faceted dielectric material portion.

7. The semiconductor structure of claim 5, wherein a portion of said gate dielectric overlies said gate spacer and includes outer sidewalls that are vertically coincident with outer sidewalls of said gate spacer.

8. The semiconductor structure of claim 1, further comprising a dielectric material layer having a top surface that is coplanar with a top surface of said gate electrode.

9. The semiconductor structure of claim 1, wherein top surfaces of said faceted dielectric material portion are crystallographic facets.

10. The semiconductor structure of claim 1, wherein said at least one source region and said at least one drain region have a doping of a first conductivity type, and said channel region has a doping of a second conductivity type that is the opposite of said first conductivity type.

11. A method of forming a semiconductor structure comprising:
    forming at least one semiconductor material portion on an insulator layer;
    forming a dielectric material layer over said at least one semiconductor material portion;
    separating each of said at least one semiconductor material portion into a source region and a drain region by etching sub-portions of said at least one semiconductor material portion;
    growing a faceted dielectric material portion on said insulator layer between said at least one source region and said at least one drain region, said faceted dielectric material portion having a variable thickness that increases with a lateral distance from a periphery of said faceted dielectric material portion at peripheral sub-portions of said faceted dielectric material portion that adjoin said at least one source region or said at least one drain region;
    growing a channel region comprising a semiconductor material from a top surface of said faceted dielectric material portion within said gate cavity; and
    forming a gate dielectric and a gate electrode on said contoured channel region and within said gate cavity.

12. The method of claim 11, further comprising:
    forming a disposable gate structure over said at least one semiconductor material portion; and
    forming a gate cavity by removing said disposable gate structure, wherein said sub-portions of said at least one semiconductor material portion are etched underneath said gate cavity.

13. The method of claim 12, further comprising planarizing said dielectric material layer employing a top surface of said disposable gate structure as a stopping surface.

14. The method of claim 12, further comprising forming a gate spacer on sidewalls of said gate cavity after formation of said channel region.

15. The method of claim 12, wherein all sidewalls of said gate cavity are vertical and extends from a top surface of said insulator layer to a top surface of said dielectric material layer after formation of said at least one source region and said at least one drain region.

16. The method of claim 11, wherein said faceted dielectric material portion is deposited as a single crystalline structure, and said channel region is deposited as another single crystalline structure that is epitaxially aligned to said faceted dielectric material portion.

17. The method of claim 16, wherein said insulator layer is provided as a single crystalline insulator layer, and said faceted dielectric material portion is epitaxially aligned to a crystallographic structure of said single crystalline insulator layer.

18. The method of claim 11, wherein said insulator layer is provided as a single crystalline insulator layer, and each of said at least one semiconductor material portion is formed by patterning a single crystalline semiconductor material layer that is epitaxially aligned to said single crystalline insulator layer.

19. The method of claim 11, wherein said faceted dielectric material portion is formed by selective epitaxy of an insulator material, and is formed with crystallographic facets.

20. The method of claim 11, wherein said channel region is formed by a selective epitaxy process that provides growth of said semiconductor material from surfaces of said faceted dielectric material portion while suppressing growth of said semiconductor material from surfaces of said at least one source region and said at least one drain region.

* * * * *